(12) United States Patent
Chandrashekar et al.

(10) Patent No.: US 8,153,520 B1
(45) Date of Patent: Apr. 10, 2012

(54) THINNING TUNGSTEN LAYER AFTER THROUGH SILICON VIA FILLING

(75) Inventors: Anand Chandrashekar, Sunnyvale, CA (US); Raashina Humayun, Fremont, CA (US); Michal Danek, Cupertino, CA (US)

(73) Assignee: Novellus Systems, Inc., San Jose, CA (US)

( * ) Notice: Subject to any disclaimer, the term of this patent is extended or adjusted under 35 U.S.C. 154(b) by 334 days.

(21) Appl. No.: 12/534,566

(22) Filed: Aug. 3, 2009

(51) Int. Cl.
*H01L 21/44* (2006.01)

(52) U.S. Cl. ........ 438/667; 438/457; 438/637; 438/648; 438/656

(58) Field of Classification Search .................. 438/457, 438/637, 648, 656, 667
See application file for complete search history.

(56) References Cited

U.S. PATENT DOCUMENTS

| | | | |
|---|---|---|---|
| 5,164,330 A | 11/1992 | Davis et al. | |
| 5,747,379 A | 5/1998 | Huang et al. | |
| 5,767,015 A | 6/1998 | Tabara | |
| 5,807,786 A | 9/1998 | Chang | |
| 5,866,483 A | 2/1999 | Shiau et al. | |
| 6,011,311 A | 1/2000 | Hsing et al. | |
| 6,221,754 B1 | 4/2001 | Chiou et al. | |
| 6,245,654 B1 | 6/2001 | Shih et al. | |
| 6,376,376 B1 * | 4/2002 | Lim et al. | 438/687 |
| 6,593,233 B1 * | 7/2003 | Miyazaki et al. | 438/652 |
| 6,635,965 B1 | 10/2003 | Lee et al. | |
| 6,683,000 B2 | 1/2004 | Fukui et al. | |
| 6,844,258 B1 | 1/2005 | Fair et al. | |
| 7,005,372 B2 | 2/2006 | Levy et al. | |
| 7,141,494 B2 | 11/2006 | Lee et al. | |
| 7,193,369 B2 | 3/2007 | Min et al. | |
| 7,578,944 B2 | 8/2009 | Min et al. | |
| 2002/0177325 A1 | 11/2002 | Takewaka et al. | |
| 2003/0082902 A1 | 5/2003 | Fukui et al. | |
| 2004/0079632 A1 | 4/2004 | Ahmad et al. | |
| 2005/0031786 A1 | 2/2005 | Lee et al. | |
| 2005/0250316 A1 * | 11/2005 | Choi et al. | 438/637 |
| 2005/0275941 A1 * | 12/2005 | Liu et al. | 359/407 |
| 2006/0084269 A1 | 4/2006 | Min et al. | |
| 2007/0187362 A1 | 8/2007 | Nakagawa et al. | |
| 2010/0072623 A1 | 3/2010 | Prindle et al. | |
| 2010/0144140 A1 | 6/2010 | Chandrashekar et al. | |
| 2011/0159690 A1 | 6/2011 | Chandrashekar et al. | |

OTHER PUBLICATIONS

Dimensions of Wafer as described by Wikepedia 2008.*
Deposition Process, Oxford Electronics, 1996.*
C.K. Tsang et al, "CMOS—compatible through silicon vias for 3D process integration", Materials Research Society 2007 Symposium Proceedings vol. 970, paper 0970-Y01-01.
U.S. Patent Application entitled, "Depositing Tungsten Into High Aspect Ratio Features", U.S. Appl. No. 12/535,464, filed Aug. 4, 2009.
U.S. Patent Application entitled, "Method for Depositing Tungsten Film Having Low Resistivity, Low Roughness and High Reflectivity", U.S. Appl. No. 12/332,017, filed Dec. 10, 2008.

(Continued)

*Primary Examiner* — Matthew Landau
*Assistant Examiner* — Sonya McCall Shepard
(74) *Attorney, Agent, or Firm* — Weaver Austin Villeneuve & Sampson LLP

(57) ABSTRACT

Methods of processing partially manufactured semiconductor substrates with one or more through silicon vias to partially remove a tungsten layer formed on the field region during filling the through silicon vias are provided. In certain embodiments, the methods produce substrates with reduced bowing than the bowing present after through silicon vias filling. Substrates with reduced bowing are easier to handle and may expedite subsequent processes.

22 Claims, 9 Drawing Sheets

OTHER PUBLICATIONS

U.S. Patent Application entitled, "Methods for Depositing Tungsten Films Having Low Resistivity for Gapfill Applications", U.S. Appl. No. 12/535,377, filed Aug. 5, 2009.
U.S. Patent Application entitled, "Method for Reducing Tungsten Roughness and Improving Reflectivity," U.S. Appl. No. 12/202,126, filed Aug. 29, 2008.
U.S. Patent Application entitled, Methods for Growing Low-Resitivity Tungsten for High Aspect Ratio and Small Features, U.S. Appl. No. 12/030,645, filed Feb. 13, 2008.
U.S. Patent Application entitled, "Method for Improving Uniformity and Adhesion of Low Resistivity Tungsten Film", U.S. Appl. No. 11/951,236, filed Dec. 5, 2007.
U.S. Patent Application entitled, "Method for Depositing Thin Tungsten Film With Low Resistivity and Robust Micro-Adhesion Characteristics", U.S. Appl. No. 12/407,541, filed Mar. 19, 2009.
U.S. Patent Application entitled, "Methods for Growing Low-Resitivity Tungsten Film", U.S. Appl. No. 11/265,531, filed Nov. 1, 2005.
U.S. Appl. No. 12/332,017, Office Action mailed Dec. 30, 2009.
U.S. Appl. No. 12/332,017, Office Action mailed Jul. 26, 2010.
U.S. Appl. No. 12/535,464, Office Action mailed Sep. 13, 2010.
U.S. Appl. No. 12/332,017, Office Action mailed Nov. 15, 2010.
U.S. Appl. No. 12/535,377, Office Action mailed Nov. 1, 2010.
US Patent Application entitled, "Depositing tungsten into high aspect ratio features", U.S. Appl. No. 12/833,823, filed Jul. 9, 2010.
U.S. Appl. No. 12/202,126, Office Action mailed Feb. 7, 2011.
U.S. Appl. No. 12/535,464, Office Action mailed Apr. 14, 2011.
U.S. Appl. No. 12/535,377, Office Action mailed Jun. 14, 2011.
U.S. Appl. No. 12/332,017, Office Action mailed Jul. 22, 2011.
U.S. Appl. No. 12/535,464, Office Action mailed Jul. 28, 2011.
KR patent application No. 10-2009-0122292, Office Action mailed Aug. 29, 2011.
Korean Patent Abstracts, Publication No. 1020030035877, published May 9, 2003, downloaded from http://kpa.kipris.or.kr/kpa2010 on Aug. 29, 2011.
U.S. Appl. No. 12/535,464, Office Action mailed Oct. 12, 2011.

* cited by examiner

THINNING TUNGSTEN LAYER AFTER THROUGH SILICON VIA FILLING

BACKGROUND

Tungsten deposition using chemical vapor deposition (CVD) techniques is an integral part of many semiconductor fabrication processes. Tungsten may be used for horizontal interconnects, vias between adjacent metal layers, contacts between a first metal layer and the devices on the silicon substrate, and through silicon vias. In a conventional tungsten deposition process, the substrate is heated to the process temperature in a deposition chamber, and a thin layer of tungsten that serves as a seed or nucleation layer is deposited. Thereafter, the remainder of the tungsten film (the bulk layer) is deposited on the nucleation layer. Conventionally, the tungsten bulk layer is formed by the reduction of tungsten hexafluoride ($WF_6$) with hydrogen ($H_2$). Tungsten layers deposit over an entire exposed surface area of the substrate including features and a field region.

A through-silicon via (TSV) is a vertical electrical connection passing completely through a silicon wafer or die. TSV technology is used to create 3D packages and integrated circuits (IC). It provides interconnection of vertically aligned electronic devices through internal wiring that significantly reduces complexity and overall dimensions of a multi-level electronic circuit. Tungsten is an attractive material for TSV applications because of its high electrical conductivity, resistance to electromigration, and thermal expansion coefficient comparable to that of silicon.

SUMMARY

Methods of processing partially manufactured semiconductor substrates with one or more through silicon vias to partially remove a tungsten layer formed on the field region during filling the through silicon vias are provided. In certain embodiments, these methods include positioning a substrate, such as a 300-mm wafer or any other suitable substrate, on a layer processing station of a processing chamber. The layer processing station may be the same station used for tungsten deposition or may be a separate station. The substrate has one or more TSVs filled with tungsten. The substrate also has an initial tungsten layer formed on the substrate's field region during TSV filling. This layer extends above and adjacent to the TSVs substantially covering the field region and causing substrate bowing.

Once the etchant is introduced, the field region of the substrate is exposed to the etchant. A part of the initial tungsten layer is removed to form an etched tungsten layer (i.e., a partially removed/etched tungsten layer). The etched tungsten layer substantially covers the substrate's field region and the TSVs, which remain filled after the removal operation. The substrate bowing is reduced after partially removing the initial tungsten layer.

In certain embodiments, a partially manufactured semiconductor substrate is provided. The substrate includes a base layer comprising a 300-mm silicon wafer, one or more through silicon vias filled with tungsten, and an etched tungsten layer resulting from etching an initial tungsten layer formed on a field region of the substrate during filling of the through silicon vias. The through silicon vias may have an aspect ratio of greater than about 10 and an opening diameter of at least about 1 micrometer. The etched tungsten layer may substantially cover the field region of the substrate. The etched tungsten layer may have a thickness of less than about 500 nm. The substrate has a bow of less than about 500 µm.

DETAILED DESCRIPTION OF EXAMPLE EMBODIMENTS

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

Introduction

A through-silicon via (TSV) is a vertical electrical connection passing completely through a silicon wafer or a die. TSV technology may be used in 3D packages and integrated circuits, sometimes collectively referred to as 3D stacking. For example, a 3D package may contain two or more integrated circuits (ICs) stacked vertically so that they occupy less space. While stacked ICs may be wired together along their edges, such wiring increases the stack's dimensions and usually requires extra layers between the ICs. TSVs provide connections through the body of the ICs leading to smaller stacks. Similarly, a 3D single IC may be built by stacking several silicon wafers and interconnecting them vertically. Such stacks behave as a single device and can have shorter critical electrical paths leading to faster operation.

Electronic circuits using TSVs may be bonded in several ways. One method is "wafer-to-wafer," where two or more semiconductor wafers having circuitry are aligned, bonded, and diced into 3D ICs. Each wafer may be thinned before or after bonding. The thinning process includes removal of the wafer material to expose the bottom part of the TSV. TSVs may be formed into the wafers either before bonding or else created in the stack after bonding and may pass through the silicon substrates between active layers and an external bond pad. Another method is "die-to-wafer" where only one wafer is diced and then the single dies are aligned and bonded onto die sites of the second wafer. The third method is "die-to-die" where multiple dies are aligned and bonded. Similar to the first method, thinning and connections may be built at any stage in the last two methods.

Figure 1:
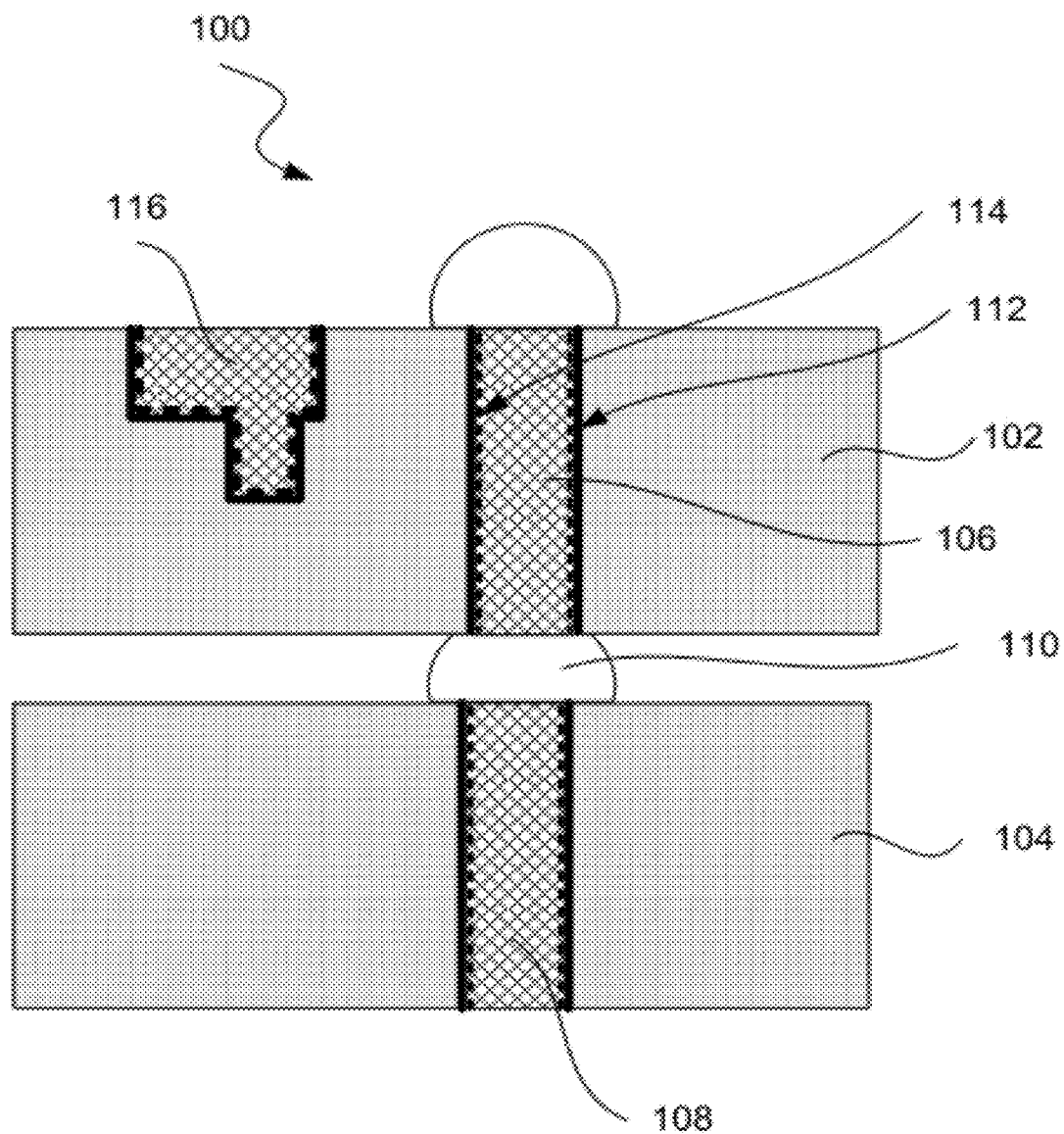
FIG. 1 illustrates an assembly including two substrate layers and corresponding through silicon vias according to certain embodiments.

FIG. 1 illustrates an assembly 100 having two substrates 102 and 104. Each substrate may have a corresponding TSV. For example, the substrate 102 is shown to have a TSV 106, while the substrate 104 is shown to have a TSV 108. TSVs may be provided in dies, wafers, or other appropriate substrate. These are collectively referred to in this description as a semiconductor substrate. Examples of the material suitable for the substrate 104 include, but are not limited to silicon, silicon on insulator, silicon on sapphire, and gallium arsenide.

Fabricating an assembly 100 starts with forming a hole in semiconductor substrates 102 and 104. Holes may be formed before or after stacking the two substrates 102 and 104 as described below. TSV holes must be sufficiently deep to go through one or more layers of the substrate. In certain embodiments, TSV holes are between about 5 micrometers and 400 micrometers deep or, in more specific embodiments, between about 10 micrometers and 100 micrometers deep. TSV hole depth typically depends on a substrate thickness and a TSV type further described below in the context of Table 1. TSV cross-section is typically measured at a TSV opening, i.e., an opening on the substrate surface from which the TSV is formed. In certain embodiments, a TSV opening diameter is between about 1 micrometers and 100 micrometers or, in more specific embodiments, between about 2 micrometers and 20 micrometers. Similar to a TSV hole depth, a TSV opening diameter depends on a TSV type. Additionally, a TSV opening diameter correlates to a TSV hole depth, i.e., there are certain aspects ratios that are possible and typical for TSV applications. In the context of this description, an aspect ratio is defined as a ratio of TSV hole depth to a TSV opening diameter. In certain embodiments, TSV aspect ratios are maximized based on equipment capabilities used to make TSV holes. A TSV hole aspect ratio may be between about 3:1 to 30:1 or, in more specific embodiments, between about 5:1 and 20:1.

As mentioned, TSV size generally depends on a TSV type, which is defined by a stage in the overall 3D stacking process when TSVs are formed. A TSV can be formed before stacking substrates ("via first") or after stacking ("via last"). In the "via-first" configuration, TSVs may be formed before or after creating CMOS structures. In the "via-last" configuration, TSVs may be formed before or after bonding. Moreover, in both configurations, substrate thinning to expose the bottom of filled TSVs may be performed before or after bonding. Table 1 summarizes typical TSV dimensions (in micrometers) for various TSV configurations. Methods described herein that include partial removal of the tungsten layer formed on the field region during TSV filling may be particularly useful for large size vias. Generally speaking, this method is applicable to any substrates with any features filled with tungsten and having openings more than 1 micrometer or, in more specific embodiments, more than 2 micrometers.

TABLE 1

|  |  | "Via-First" | | "Via-Last" | |
|---|---|---|---|---|---|
|  |  | Before CMOS | After CMOS | Before Bonding | After Bonding |
| Diameter [μm] | Thinning Before Bonding | 2-5 | 5-20 | 20-50 | 5-50 |
| Depth [μm] | | 30-50 | 40-150 | 50-400 | 30-150 |
| Diameter [μm] | Thinning After Bonding | 1-5 | 1-5 | 3-5 | 3-5 |
| Depth [μm] | | 5-25 | 5-25 | 5-25 | 5-25 |

Once a TSV hole is formed, a diffusion barrier layer 112 may be deposited to form a conformal layer that prevents diffusion of tungsten from a TSV into surrounding materials of the substrate. Materials for the diffusion barrier layer 112 may include tungsten nitride, titanium, titanium nitride, and others. The thicknesses of the barrier layer 112 may be between about 50 Angstroms and 1000 Angstroms or, in more specific embodiments, between about 100 Angstroms and 500 Angstroms. The barrier layer 112 is typically conformal with at least 90% step coverage. A tungsten nucleation layer 114 and a tungsten bulk layer 106 (because the bulk layer is the largest element of a TSV is shares the same element number, i.e., 106, as the TSV) are then deposited to fill TSVs using processes described and referenced below. In certain embodiments, the TSV 108 and other TSV in the substrates 102 and 104 and other substrates may have the same elements, e.g., a diffusion barrier layer, a tungsten nucleation layer, and a tungsten bulk layer. Finally, a part of the tungsten layer formed on the field region during TSV filling is removed using a process described above. Thinning and bonding of substrates is also performed at certain stages of the overall process in accordance to a TSV type described above in the context of Table 1. For example, a solder bump 110 may be formed between two TSVs 106 and 108 for bonding as illustrated in FIG. 1. The stack may include additional dies and additional TSVs as well as other IC features 116. For example, one of the TSVs may be further interconnected to yet another TSV in another and so on. A stack including several dies may also be coupled to a heat spreader to assist in dissipation of the heat generated by the stack.

Tungsten is an attractive material for TSV applications because of its high electrical conductivity. Because of its high resistance to electromigration, tungsten supports high current densities experienced in complex integration schemes, such as 3D packages and integrated circuits, as well as increased device speed. Furthermore, tungsten has good thermal conductivity and is available in a highly pure state. Tungsten filling is a conformal deposition process with good fill properties. The coefficient of thermal expansion (CTE) for tungsten is more comparable to that of silicon than, for example, such coefficients for copper and silicon. More specifically, the CTE of silicon, tungsten, and copper are, respectively, about 3 ppm/° C., about 4.6 ppm/° C., and about 16 ppm/° C. Further, tungsten can be filled over a conformal nucleation layer.

A typical tungsten TSV process includes formation of TSV holes followed by deposition of a diffusion barrier layer, a tungsten nucleation layer, and a tungsten bulk layer. TSV holes must be sufficiently deep to pass through silicon. Even high aspect ratio TSVs generally have opening diameters that are large in comparison to other IC features. Thus, substantial amounts of tungsten need to be deposited on a substrate to fill TSVs, which leads to formation of thick tungsten deposit on a field region. These field region deposits cause substrate deformation and interfere with subsequent processes, such as Chemical Mechanical Planarization (CMP). Even in cases where annular-shaped TSV holes have been used to reduce the volume of metal, the annular width can still be several microns which can lead substrate bowing (see, e.g. C. K. Tsang et al, "CMOS-compatible through silicon vias for 3D process integration", Materials Research Society 2007 Symposium Proceedings vol. 970, paper 0970-Y01-01).

Depositing Tungsten into Large Features

Methods of depositing tungsten films using chemical vapor deposition (CVD) are described in U.S. patent application Ser. No. 12/202,126, entitled "Method For Reducing Tungsten Roughness And Improving Reflectivity," filed Aug. 29, 2008, which is incorporated herein its entirety for the purposes of describing tungsten deposition processes.

Figure 2:
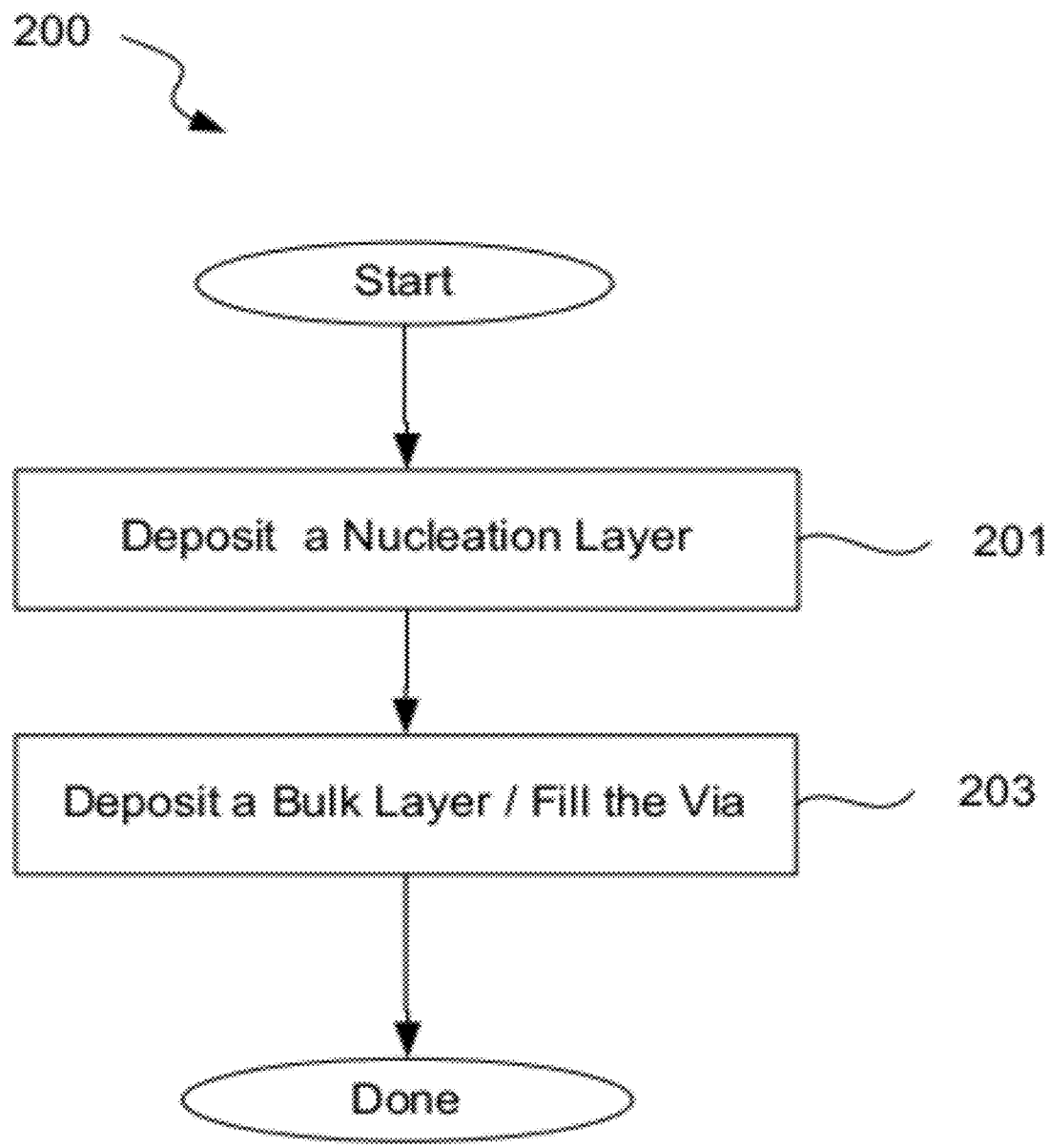
FIG. 2 illustrates a tungsten deposition process for filling through silicon vias according to certain embodiments.

FIG. 2 illustrates a tungsten deposition process 200 that may be used for filling one or more TSVs according to certain embodiments. The process begins by depositing a tungsten nucleation layer on a substrate (block 201). The substrate typically has one or more TSV holes to accommodate TSVs like the ones described above. In general, a nucleation layer is a thin conformal layer that serves to facilitate the subsequent formation of a bulk material thereon. In certain embodiments, the nucleation layer is deposited using a pulsed nucleation layer (PNL) technique. In a PNL technique, pulses of the reducing agent, purge gases, and tungsten-containing precursors are sequentially injected into and purged from the reaction chamber. The process is repeated in a cyclical fashion until the desired thickness is achieved. PNL broadly embodies any cyclical process of sequentially adding reactants for reaction on a semiconductor substrate, including atomic layer deposition (ALD) techniques.

PNL techniques for depositing tungsten nucleation layers are described in U.S. patent application Ser. No. 12/030,645, entitled "METHODS FOR GROWING LOW-RESISTIVITY TUNGSTEN FOR HIGH ASPECT RATIO AND SMALL FEATURES," filed on Feb. 13, 2008, U.S. patent application Ser. No. 11/951,236, entitled "METHOD FOR IMPROVING UNIFORMITY AND ADHESION OF LOW RESISTIVITY TUNGSTEN FILM", filed Dec. 5, 2007, and U.S. patent application Ser. No. 12/407,541, entitled "METHOD FOR DEPOSITING THIN TUNGSTEN FILM WITH LOW RESISTIVITY AND ROBUST MICRO-ADHESION CHARACTERISTICS", filed on Mar. 19, 2009, all of which are incorporated by reference herein its entirety for the purposes of describing tungsten deposition process. Additional discussion regarding PNL type processes can be found in U.S. Pat. Nos. 6,635,965, 6,844,258, 7,005,372 and 7,141,494 as well as in U.S. patent application Ser. No. 11/265,531, also incorporated herein by reference. The methods described herein are not limited to a particular method of tungsten nucleation layer deposition, but include deposition of bulk tungsten film on tungsten nucleation layers formed by any method including PNL, ALD, CVD, PVD and any other method. Moreover, in certain embodiments, bulk tungsten may be deposited directly without use of a nucleation layer.

Returning to FIG. 2, after the tungsten nucleation layer is deposited, the process continues with deposition of a bulk tungsten layer over the nucleation layer until TSV holes are completely filled (block 203). In certain embodiments, bulk deposition involves a chemical vapor deposition (CVD) process in which a tungsten-containing precursor is reduced by hydrogen to deposit tungsten. While tungsten hexafluoride ($WF_6$) is often used, the process may be performed with other tungsten precursors, including, but not limited to, tungsten hexachloride ($WCl_6$), organo-metallic precursors, and precursors that are free of fluorine such as MDNOW (methylcyclopentadienyl-dicarbonyl-nitrosyl-tungsten) and EDNOW (ethylcyclopentadienyl-dicarbonyl-nitrosyl-tungsten). In addition, while hydrogen is generally used as the reducing agent in the CVD deposition of the bulk tungsten layer, other reducing agents including silane may be used in addition or instead of hydrogen without departing from the scope of the invention. In another embodiment, tungsten hexacarbonyl ($W(CO)_6$) may be used with or without a reducing agent. Unlike with the PNL processes described above, in a CVD technique, the $WF_6$ and $H_2$ or other reactants are simultaneously introduced into the reaction chamber. This produces a continuous chemical reaction of mix reactant gases that continuously forms tungsten film on the substrate surface.

According to various embodiments, the methods described herein are not limited to a particular method of forming a filled TSV but may include any appropriate deposition technique. As is described below, in many embodiments, regardless of the technique by which the tungsten is deposited, the substrate is deformed as a result of the deposition. In particular embodiments, the methods include tungsten deposited by any technique that causes bowing or other deformation.

Substrate Deformation

During deposition of a nucleation and bulk layers, tungsten containing precursors contact the entire exposed substrate surface. As a result, tungsten deposits both inside TSVs and on a field region, which is defined as a top surface of the substrate in between TSV openings. Because TSVs are relative large features, filling TSVs leads to formation of a thick tungsten layer on a field region. The thickness of this layer is comparable to opening diameters of TSVs and could be several microns.

Tungsten TSV applications usually involve deposition of tungsten in morphological states that have high, intrinsic residual stresses. In certain examples, compressive stresses may exceed 1 GPa. Further, although the coefficient of thermal expansion (CTE) of tungsten is a closer match to that of silicon that is that of copper, the CTE difference between tungsten and silicon can result in additional film stress. As a result of both intrinsic and CTE-related stresses, a substrate may form a bow after formation of a tungsten layer on the field region (e.g., during filling of through silicon vias) especially when the substrate is cooled down.

Figure 3A:
FIG. 3A illustrates an example substrate before filling TSVs on the substrate with tungsten.

FIG. 3A is an illustrative representation of a typical semiconductor substrate 301 that is free from any compressive films deposited on its surfaces, e.g., before filling TSVs with high stress tungsten. The substrate is typically substantially flat, e.g., it bows less than 300 μm according to certain SEMI standards for a 300-mm wafer. Typically, a wafer bows very little before tungsten deposition. In certain embodiments, any deformations that may be present are attributable to the substrate itself and not materials deposited on its surface.

As explained above, filling TSVs leads to formation of a tungsten layer 302 on a field region. This layer 302 is also referred to as an initial tungsten layer to distinguish it from modified states of this layer, for example, an etched tungsten layer. The residual stress is transferred from the initial tungsten layer 302 to the substrate 301 and can cause bowing of the entire stack, i.e., the substrate 301 and the layer 302, as, for examples, illustrated in FIG. 3B. For brevity, a substrate with a tungsten layer (either an initial tungsten layer or an etched tungsten layer) is often referred to as a substrate. One having ordinary skills will be able to make a distinction among various states of substrate (e.g., without a layer, with an initial tungsten layer, or with an etched tungsten layer) from the context of the description. Further, as mentioned above, bowing generally becomes more severe during substrate cooling, for example, during substrate removal from a processing apparatus and placing to a Front Opening Unified Pod (FOUP). In certain embodiments, the substrate bowing may be so great that this removal operation can not performed on a standard substrate handling equipment.

Figure 3B:
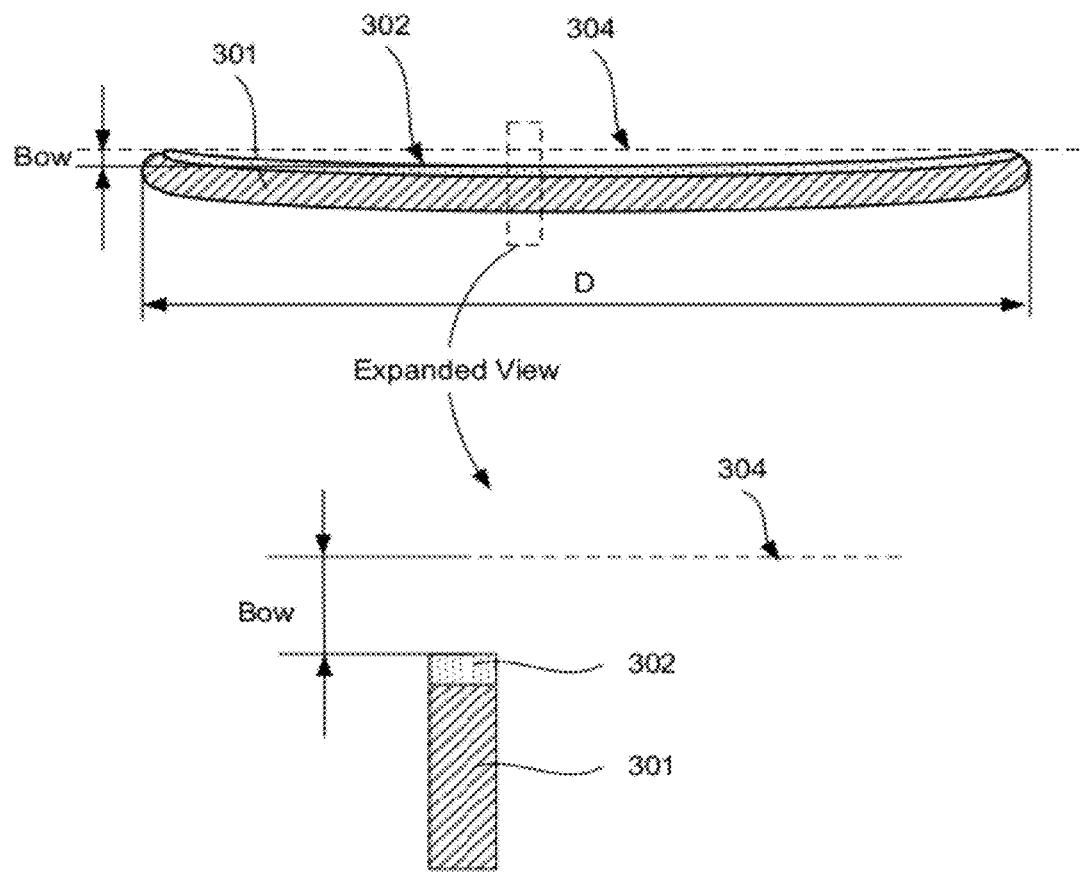
FIG. 3B illustrates an example substrate after filling TSVs on the substrate with tungsten.

A bowed substrate can be generally described as having a convex side and concave side. A tungsten layer may be present on a concave side or a convex side depending on materials and residual stresses (compressive or tensile) of the stack. Many morphological structures of tungsten result in tensile layer. For example, FIG. 3B illustrates a tungsten layer 302 on the concave side of the substrate 301. "Bowing" is defined as a maximum deviation of a concave side of the substrate from a plane 304 defined by the edges of the substrate. Typically, this plane 304 coincides with the top surface (a field region) of the flat substrate. A level of bowing depends on various factors, such as an average thickness of the tungsten layer, a stress level in the layer (or tungsten morphology), substrate dimensions (e.g., thickness, diameter) and materials, other layers and features present on the substrate, environmental conditions (e.g., temperature), and others. For the purposes of this description, when two or more levels of bowing are compared for different substrates or the same substrate at two different states (e.g., the same substrate before and after etching), such comparison corresponds to the two or more measurements of bowing that is performed at about the same temperature unless otherwise provided. Further, any values for bowing specified in this description correspond to measurement performed at a room temperature, which is about 25° C., unless otherwise specified.

Table 2 presents several measured values of thicknesses of the tungsten layers on the field regions of the typical 300-millimeter wafers and the corresponding bowing values of these wafers measured at approximately room temperature. The correlation between the thickness and bowing values is apparent, i.e., thicker tungsten layers on the field region cause more substrate deformation. Substrate deformation problem is particularly severe after TSV filling, where tungsten layers on the field region are particularly thick. For a given level of stressed blanket film on a substrate, mechanical analysis indicates that the substrate bow goes as approximately the fourth power of the substrate diameter and inversely as approximately the cube of the substrate thickness. During scaling from 200-mm wafers to 300-mm wafers, thicknesses of these wafers did not change resulting in 300-mm wafers being more prone to bowing. It is expected that larger substrates (e.g., 450-mm wafers) will be even more susceptible to bowing.

TABLE 2

| Tungsten Layer Thickness | Bowing of 300-millimeter wafer (0.75 millimeters thick) |
| --- | --- |
| ~1000 nanometers | ~550 micrometers |
| ~550 nanometers | ~350 micrometers |
| ~300 nanometers | ~200 micrometers |
| ~200 nanometers | ~125 micrometers |

Bowing can interfere with substrate handling and Chemical Mechanical Planarization (CMP). For example, typical handling equipment is designed to handle 300-mm wafers that bow less than about 500 μm. In certain cases, this threshold may be less or more. Excessive bowing can cause misalignments, scratching, contamination, uneven heat transfer, and other problems. It should be noted that although CMP is widely used to remove tungsten on the field regions of wafers, such process requires that the substrate be removed from a tungsten deposition reactor causing bowing due to temperature change. Further, CMP generally cannot be carried out at the elevated temperatures, such as greater than 100° C., that are commonly used to deposit CVD tungsten films.

Etching Process

It has been found that substrate bowing caused by filling TSVs with tungsten can be prevented or, at least substantially reduced, to levels acceptable for handling equipment and to increase CMP throughput, if a part of the tungsten layer formed on the field region during filling is removed. Various experiments were conducted to determine optimal removal processes that effective mitigate the bowing problem yet do not pose substantial risk of damaging the substrate. For example, etching may be performed after filling TSVs with tungsten such that the substrate temperature is maintained at processing levels at all times between the filling and etching. In this case, the substrate does not experience bowing caused by thermal deformation imposed by a thick initial tungsten layer. While some bowing may be present before etching, e.g., due to the post deposition residual stress, and after etching, e.g., the remaining etched tungsten layer also may also have residual stress and cause some thermal deformation, the degrees of bowing may be acceptable for handling equipment and other purposes. Alternatively, a substrate may be allowed to cooled down before etching (and after filling TSVs), such that substantial bowing is formed. However, this bowing may be reduced later after etching.

The proposed process involves etching the initial tungsten layer to partially remove this layer and form an etched tungsten layer with a certain predetermined thickness. This predetermined thickness typically corresponds to the bowing requirements. The etching process may immediately follow the TSV filling process (described above) and, in certain embodiments, performed in the same processing chamber and, in certain more specific embodiments, on the same station.

Figure 4:
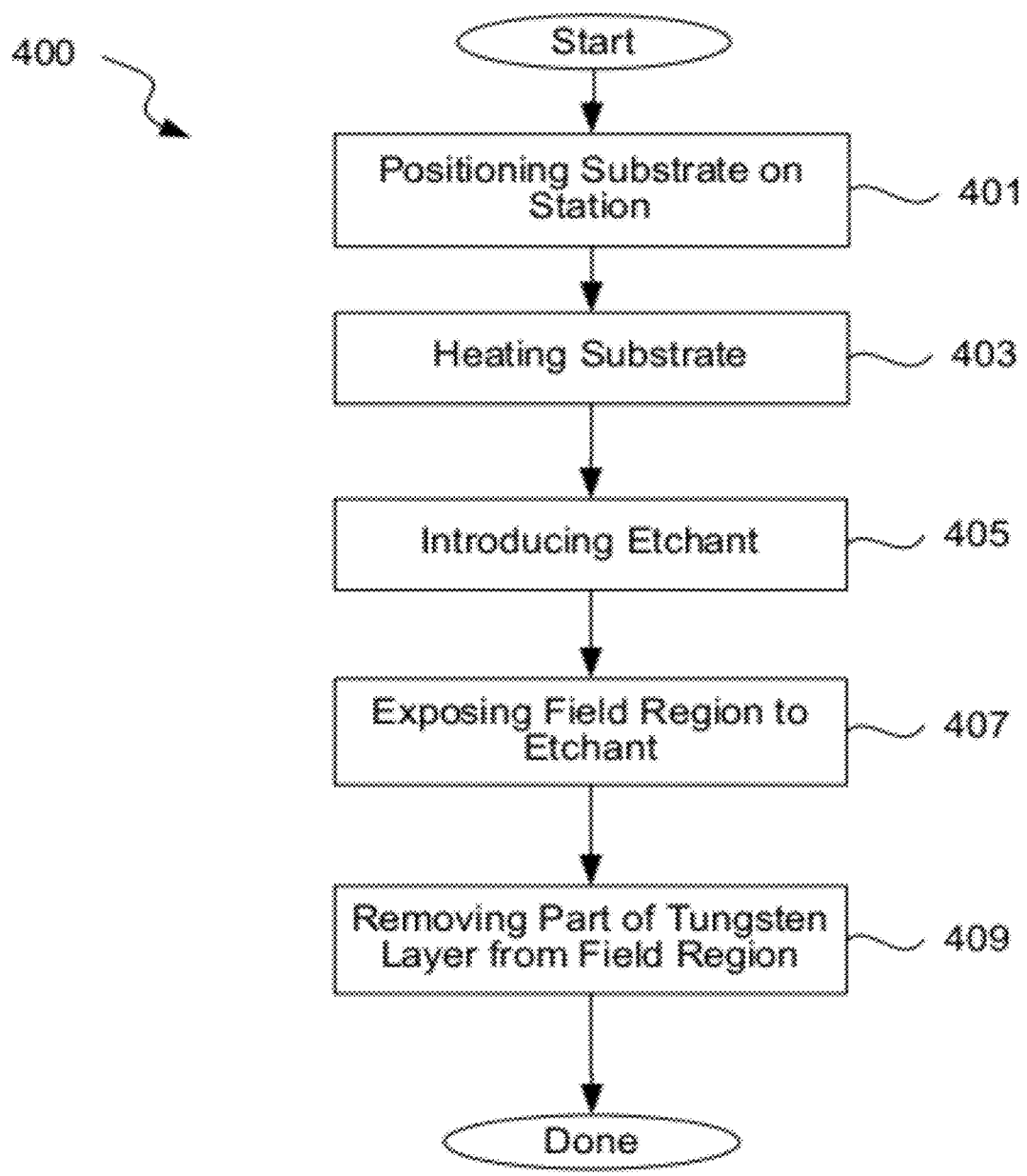
FIG. 4 is an example process flow chart illustrating various operations of a process including partial removal of the initial tungsten layer from the substrate having one or more TSVs in accordance with certain embodiments.

FIG. 4 is an example process flow chart 400 illustrating various operations of a proposed process including partial removal of the initial tungsten layer from the substrate with one or more TSVs in accordance with certain embodiments. For simplicity, the process is often referred to as a tungsten layer removal process or an etching process. However, it should be understood that only a part of the initial tungsten layer is removed to prevent damage to the underlying dielectric. Generally, a process is designed in such a way that only very little, if any, underlying substrate is exposed to the etchant.

The process 400 may start with positioning a substrate on a station of the processing chamber (block 401). This station is referred to as a layer processing station in order to distinguish it from a deposition station, where TSV filling is performed. In certain embodiments, a layer processing station is the same as a deposition station. In other embodiments, these stations are different. A processing chamber may have a single station or multiple stations. Furthermore, a processing chamber may be a part of a single-chamber apparatus or a multi-chamber apparatus. Different types of apparatuses are described below in more details.

A substrate position on a layer processing station in operation 401 includes one or more TSVs filled with tungsten. Various examples of TSV structures and TSV filling processes are described above. In certain embodiments, a TSV filling process may be followed by a layer removal process such that a substrate remains on the same station during execution of both processes. For example, TSV filling and partial removal processes may be performed on the same station to avoid handling bowed substrates that may cause misalignment, substrate damage, and other problems. In this case, operations 401 may be considered as a part of the earliest process performed on this station (e.g., TSV filling) or additional operations, such as TSV filling, are performed between operations 401 and 403. In certain embodiments, TSVs may be filled with tungsten in combination with other materials. For example, tungsten may be combined (e.g., alloyed) with another metal to improve its mechanical properties (e.g., form a tungsten-rhenium alloy). Further, multiple layers of tungsten and another material, such as tungsten nitride (WN), may be used to fill TSVs. In some of these examples, etchants used to partially remove tungsten containing materials from the field region may be chosen such that materials other than tungsten can be removed as well. For example, an etchant may include multiple components specific to removing materials used to fill TSVs.

A substrate positioned on the layer processing station prior to operation 403 has an initial tungsten layer formed on the substrate's field region during filling of the one or more TSVs. This layer extends above and adjacent to the TSVs substantially covering the field region of the substrate. The layer may also cause the substrate to bow. In certain embodiments, reasons other than substrates bowing, such as expediting a CMP process, may lead to applying this process. Accordingly, in certain embodiments, tungsten may be etched from a field region even where there is not significant bowing.

Once the substrate is on the layer process station, it may be heated to a predetermined temperature (block 403). Various devices may be used to heat a substrate, such as a heating element in a station (e.g., an electrical resistance heater installed in a pedestal or a heating fluid circulated through a pedestal), infrared lamps above the substrate, igniting plasma, etc. A predetermined temperature for the substrate is selected in such way that a chemical reaction is induced between the initial tungsten layer and an etchant upon their contact when the substrate and, as a result, tungsten in the layer are maintained at the predetermined temperature. The temperature may be selected based on an etchant composition, a desired etching rate, and other material and process parameters. In certain embodiments using fluorine based etchants, a substrate is heated to between about 300° C. and 500° C. or, in more specific embodiments, to between about 400° C. and 450° C. Other temperature ranges may be used for different types of etchants.

In certain embodiments further described above, a separate station may be used to preheat the substrate. Thus, when a substrate is positioned on the layer processing station in operation 401 less heating, and in some specific embodiments, no heating may be required. In the later case, heating operation 403 may become optional. Further, heating operation may be combined with other operations such as removing operation 409.

An etchant is introduced into a processing chamber through a distribution device (block 405). It should be noted that a transition phase typically exists where the chamber is filled with a etchant until it reaches a certain predetermined concentration (e.g., etchant partial pressure above the substrate surface). In some embodiments, heating operation 403 may continue during this phase. In other embodiments, process requirements may be such that a substrate must be heated to a predetermined temperature in operation 403 before operation 405 may proceed.

Introducing etchant may involve flowing activated species (including radicals, ions and/or high energy molecules) from a remote plasma generator into the chamber through a shower head positioned above the substrate. The etchant used in a process and introduced into a system (e.g., flown into a remote plasma generator) may be a fluorine based etchant, such as nitrogen trifluoride ($NF_3$), fluorine ($F_2$), tetrafluoromethane ($CF_4$), tetrafluoroethylene ($C_2F_4$), hexafluoroethane ($C_2F_6$), octafluoropropane ($C_3F_8$), sulfur hexafluoride ($SF_6$), and others.

Flow rates of the etchant typically depend on a size of the chamber, etching rates, etching uniformity, and other parameters. For example, a flow rate for a single station in the four-station 195-liter Vector PECVD chamber may be between about 100 sccm and 10,000 sccm. Further, power output of a remote plasma generator, if one is used, depends on a chamber pressure, a carrier gas flow rate, an etchant flow rate, and other process parameters. In certain embodiments, the chamber pressure is less than about 40 Torr, the etchant (e.g., NF3) flow rate is less than about 10,000 sccm.

In a remote plasma generator some etchant molecules are activated to form radicals, ions, high energy atoms and molecules, which are collectively referred to as "activated species". Activated species are more reactive with tungsten than the etchant molecules. A remote plasma generator may provide high degree of dissociation of etchant molecules into activated species, usually 90% and higher. Still some molecules may pass through a remote plasma generator without being activated. Many activated species may return to their stable form, such as recombination of radicals back into the molecules before reaching the chamber. In certain embodiments, an in-situ plasma generator may be used to further activate etchant while inside the chamber and/or further induce the chemical reaction between tungsten and the etchant. It should be noted that in the context of this description, the term etchant may include both activated and non-activated species. For example, etchant may be supplied directly into the chamber without going through a remote plasma generator. In certain embodiments, in-situ plasmas may be used in lieu of a remote plasma generator. In other embodiments, activated species may be supplied solely from a remote plasma generator, i.e., with no in-situ plasma component.

A field region that includes the initial tungsten layer is then exposed to the etchant (block 407). The etchant reacts with tungsten forming volatile species that are evacuated from the chamber. As a result, a part of the layer is removed (block 409). It is generally not necessary to remove the entire initial tungsten layer. The initial tungsten layer may be thinned to a predetermined thickness. This thickness may be selected based on bowing requirements, CMP considerations, or other factors. For example, Table 2 above indicates when a tungsten layer is thinned from about 1000 nanometers to about 550 nanometers; the initial bowing of about 550 micrometers is reduced to about 350 micrometers. Further, a remaining layer may be needed to protect underlying materials from contact with etchant. In certain embodiments, an etched tungsten layer substantially covers the field region of the substrate and the TSVs.

Removing a part of the initial tungsten layer in operation 407 typically does not etch away tungsten from inside the TSVs at least above the level of subsequent planarization. Thus, the TSVs remain "closed" after this operation.

In certain embodiments, the removing operation 409 continues for a predetermined period of time, which could be established by etching conditions, a thickness of the initial tungsten layer, a target thickness of the etched tungsten layer, and other parameters. In the same or other embodiments, the removal operation 409 continues until substrate bowing does not reach a certain predetermined level. For example, a chamber may be equipped with one or sensors analyzing a level of wafer bowing. Overall, the bowing of the substrate may be reduced after the removal operation 409.

Certain details of tungsten film etching are described in U.S. patent application Ser. No. 12/332,017, entitled "METHOD FOR DEPOSITING TUNGSTEN FILM HAVING LOW RESISTIVITY, LOW ROUGHNESS AND HIGH REFLECTIVITY," filed Dec. 10, 2008, which is incorporated here in its entirety for this purposes.

Figure 5A:
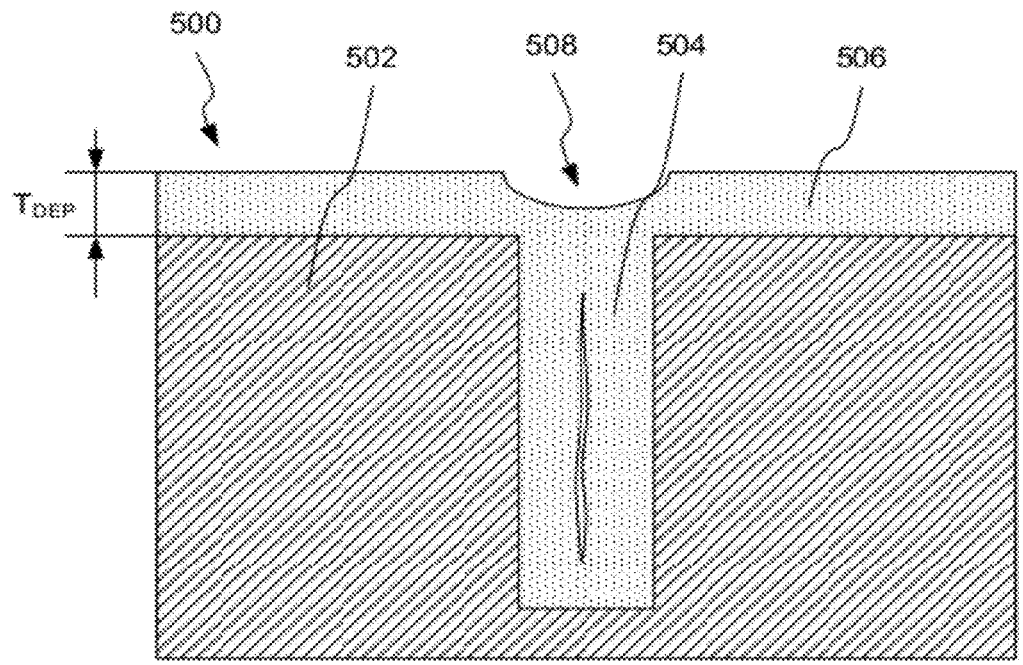
FIG. 5A illustrates a portion of a substrate after TSV filling exemplifying a filled TSV and an initial tungsten layer formed on the filled region.

FIG. 5A illustrates a part of the substrate 502 with the filled TSV 504 after completing the filling process. As previously mentioned, filling leads to formation of the initial tungsten layer 506 on a field region of the substrate. The initial tungsten layer is shown to have an average thickness $T_{DEP}$, which generally depends on the opening diameters of the largest TSV in this substrate 502 as described above. The layer may have slight indentations 508 above the TSVs 504. These indentations are formed during TSVs "closing."

Figure 5B:
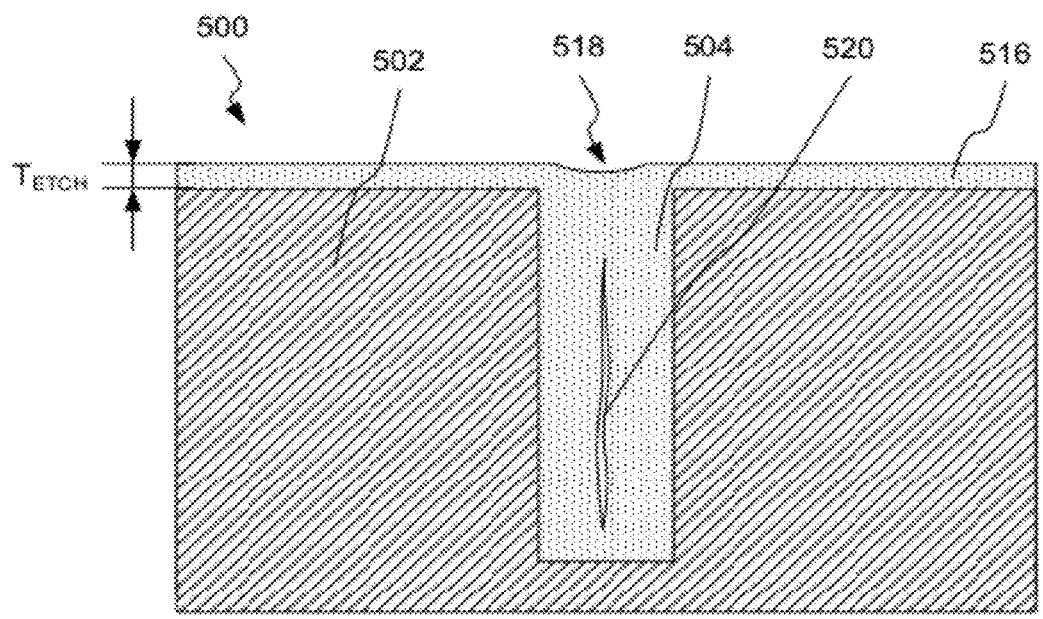
FIG. 5B illustrates a portion of a substrate after partial removal of the initial tungsten layer.

FIG. 5B illustrates the same part of the substrate 502 as in FIG. 5A but after partial removal of the initial tungsten layer. The remaining etched tungsten layer 516 has a thickness $T_{ETCH}$, which, in certain embodiments, is less than about 75% of $T_{DEP}$. In more specific embodiments, $T_{ETCH}$ is less than about 50% of $T_{DEP}$, or even more specifically less than about 25% of $T_{DEP}$. In the same or other embodiments, $T_{ETCH}$ is less than about 1000 nanometers, or more specifically less than about 500 nanometers, or even more specifically less than about 250 nanometers. Different considerations for $T_{ETCH}$ selection (e.g., substrate dimensions, residual stresses, thermal expansion coefficient) are further described above. Indentations 518 above TSVs 504 may be still present, while the TSVs remain "closed." In other words, if there is a seam 520 in a TSV 504, then seam 502 is not exposed. Typically, the lowest points in the indentations 518 after the removal process are still above the planarization level.

Apparatus

Any suitable chamber may be used to implement the proposed method. Examples of deposition apparatuses include Novellus's Sequel PECVD system, Vector PECVD system, Vector Extreme PECVD system, which are all available from Novellus Systems, Inc. of San Jose, Calif., or any of a variety of other commercially available processing systems.

Figure 6:
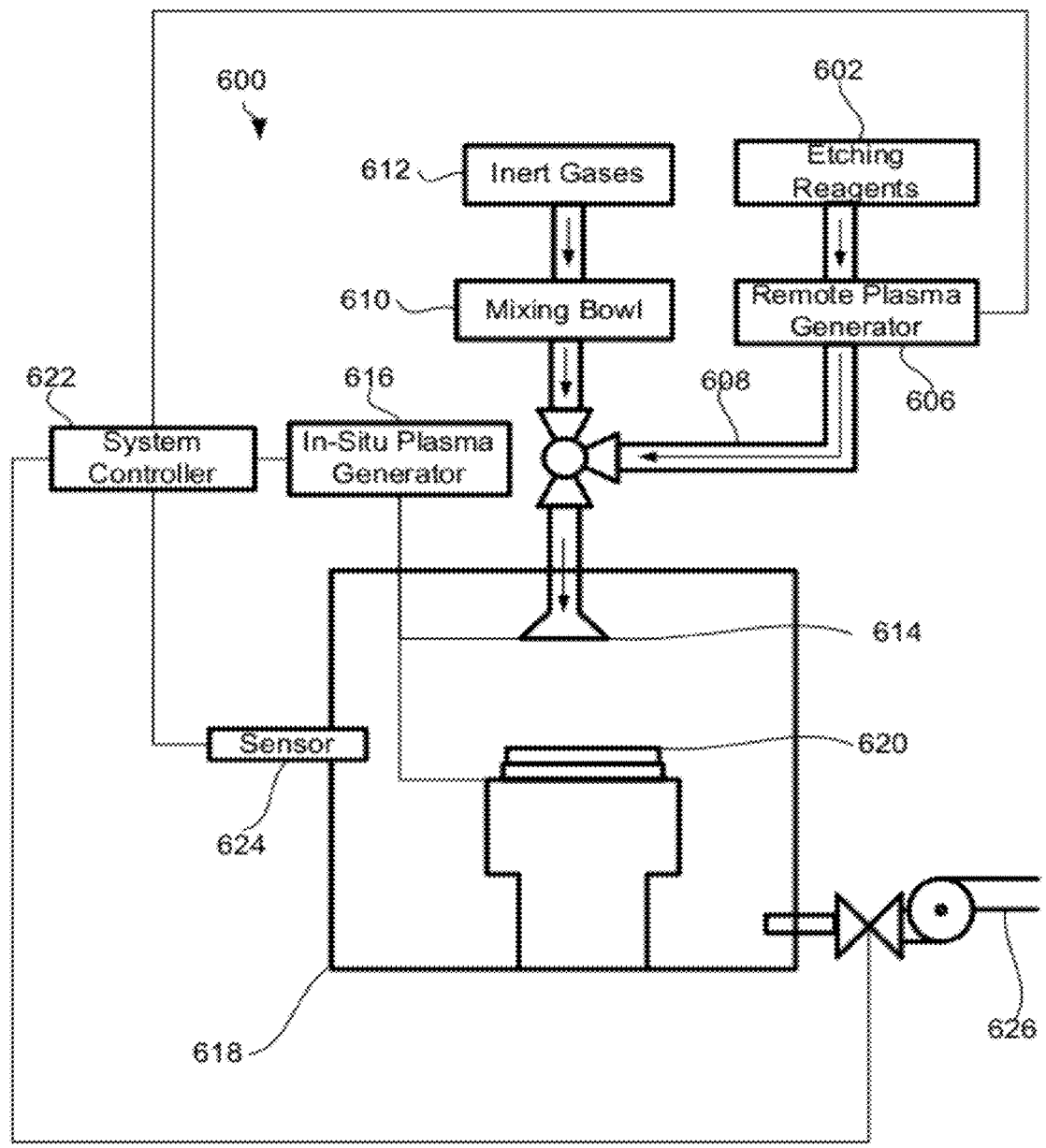
FIG. 6 illustrates a schematic representation of an apparatus, in accordance with certain embodiments, for processing a partially fabricated semiconductor substrate that includes partial removal of the initial tungsten layer from the substrate having one or more TSVs.

FIG. 6 illustrates a schematic representation of an apparatus 600 for processing a partially fabricated semiconductor substrate in accordance with certain embodiments. The apparatus 600 includes a chamber 618 with a wafer pedestal 620, a shower head 614, an in-situ plasma generator 616. The apparatus also include a system controller 622 to receive input and/or supply control signals to various devices of the apparatus 600.

The etchant and, in certain embodiments, inert gases, such as argon, helium and others, are supplied to the remote plasma generator 606 from a source 602, which may be a storage tank. Any suitable remote plasma generator may be used for activating the etchant before introducing it into the chamber 618. For example, a Remote Plasma Cleaning (RPC) units, such as ASTRON® i Type AX7670, ASTRON® e Type AX7680, ASTRON® ex Type AX7685, ASTRON® hf-s Type AX7645, all available from MKS Instruments of Andover, Mass., may be used. An RPC unit is typically a self-contained device generating weakly ionized plasma using the supplied etchant. Imbedded into the RPC unit a high power RF generator provides energy to the electrons in the plasma. This energy is then transferred to the neutral etchant molecules leading to temperature in the order of 2000K causing thermal dissociation of these molecules. An RPC unit may dissociate more than 90% of incoming etchant molecules because of its high RF energy and special channel geometry causing the etchant to adsorb most of this energy.

In certain embodiments, an etchant is flown from the remote plasma generator 606 through a connecting line 608 into the chamber 618, where the mixture is distributed through the shower head 614. In other embodiments, an etchant is flown into the chamber 618 directly completely bypassing the remote plasma generator 606 (e.g., the system 600 does not include such generator). Alternatively, the remote plasma generator 606 may be turned off while flowing the etchant into the chamber 618, for example, because activation of the etchant is not needed.

The shower head 614 or the pedestal 620 typically may have an internal plasma generator 616 attached to it. In one example, the generator 616 is a High Frequency (HF) generator capable of providing between about 0 W and 10,000 W at frequencies between about 1 MHz and 100 MHz. In a more specific embodiment, the HF generator may deliver between about 0 W to 5,000 W at about 13.56 MHz. The RF generator 616 may generate in-situ plasma to enhance removal of the initial tungsten layer. In certain embodiments, the RF generator 616 is not used during the removal operations of the process.

The chamber 618 may include a sensor 624 for sensing various process parameters, such as wafer bowing, concentrations, pressure, temperature, and others. The sensor 624 may provide information on chamber conditions during the process to the system controller 622. Examples of the sensor 624 include mass flow controllers, pressure sensors, thermocouples, and others. The sensor 624 may also include an infra-red detector or optical detector to monitor presence of gases in the chamber and control measures.

Partial removal of the initial tungsten layer generates various volatile species that are evacuated from the chamber 618. Moreover, processing is performed at certain predetermined pressure levels the chamber 618. Both of these function are achieved using a vacuum outlet 626, which may be a vacuum pump.

In certain embodiments, a system controller 622 is employed to control process parameters. The system controller 622 typically includes one or more memory devices and one or more processors. The processor may include a CPU or computer, analog and/or digital input/output connections, stepper motor controller boards, etc. Typically there will be a user interface associated with system controller 622. The user interface may include a display screen, graphical software displays of the apparatus and/or process conditions, and user input devices such as pointing devices, keyboards, touch screens, microphones, etc.

In certain embodiments, the system controller 622 controls the pressure in the reactor. The system controller 622 may also control substrate temperature, etchant flow rate, power output of the remote plasma generator 606. The system controller 622 executes system control software including sets of instructions for controlling the timing, mixture of gases, chamber pressure, chamber temperature, and other parameters of a particular process. Other computer programs stored on memory devices associated with the controller may be employed in some embodiments.

The computer program code for controlling the processes in a process sequence can be written in any conventional computer readable programming language: for example, assembly language, C, C++, Pascal, Fortran or others. Compiled object code or script is executed by the processor to perform the tasks identified in the program. The system software may be designed or configured in many different ways. For example, various chamber component subroutines or control objects may be written to control operation of the chamber components necessary to carry out the described processes. Examples of programs or sections of programs for this purpose include process gas control code, pressure control code, and plasma control code.

The controller parameters relate to process conditions such as, for example, timing of each operation, pressure inside the chamber, substrate temperature, etchant flow rare, as well as others described above. These parameters are provided to the user in the form of a recipe, and may be entered utilizing the user interface. Signals for monitoring the process may be provided by analog and/or digital input connections of the system controller 622. The signals for controlling the process are output on the analog and digital output connections of the apparatus 600.

Multi-Station Apparatus

Figure 7A:
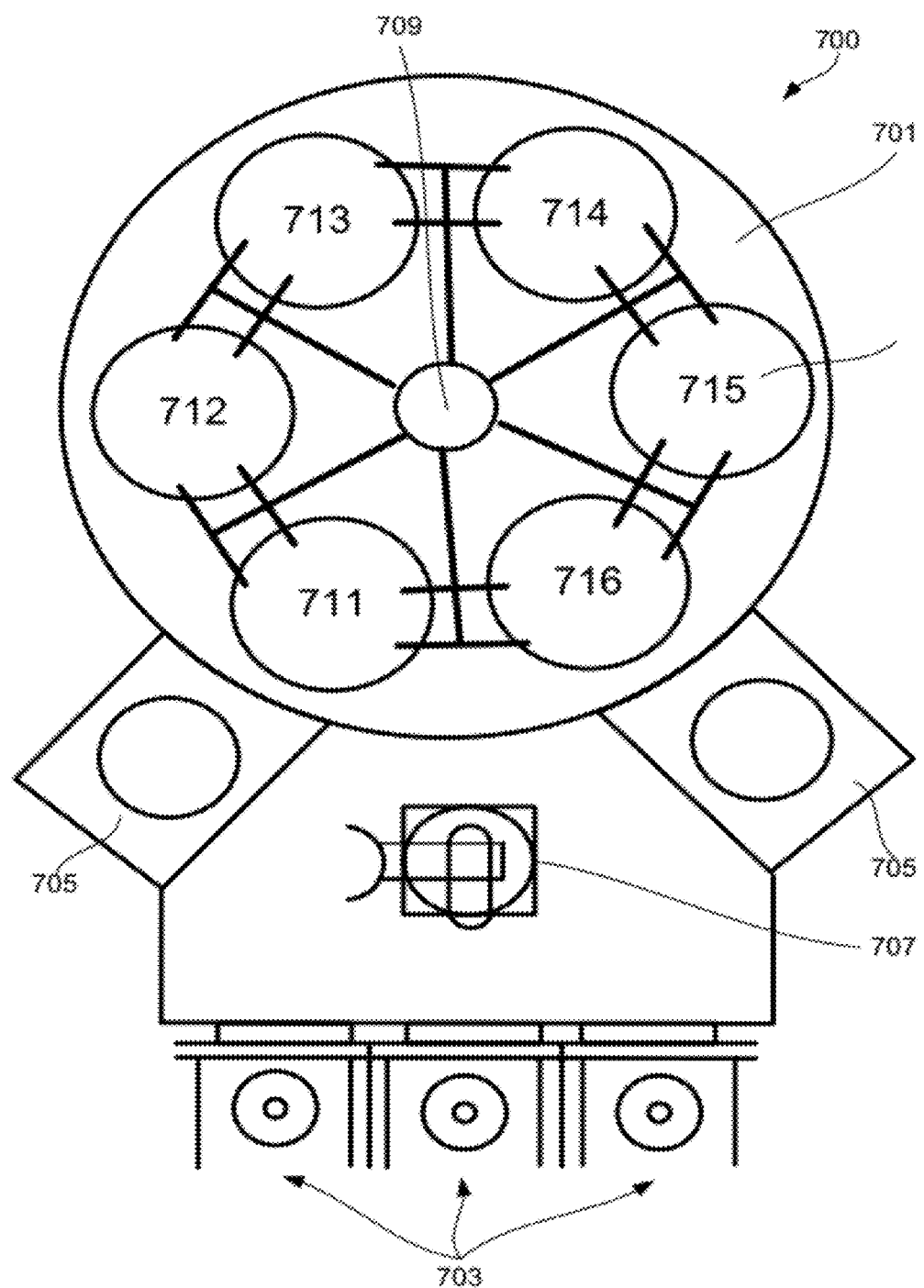
FIG. 7A shows a schematic illustration of a multi-station apparatus, in accordance with certain embodiments, for processing a partially fabricated semiconductor substrate that includes partial removal of the initial tungsten layer from the substrate having one or more TSVs.

FIG. 7A shows an example of a multi-station apparatus 700. The apparatus 700 includes a process chamber 701 and one or more cassettes 703 (e.g., Front Opening Unified Ports) for holding substrates to be processed and substrates that have completed processing. The chamber 701 may have a number of stations, for example, two stations, three stations, four stations, five stations, six stations, seven stations, eight stations, ten stations, or any other number of stations. The number of stations in usually determined by a complexity of the processing operations and a number of these operations that can be performed in a shared environment. FIG. 7A illustrates the process chamber 701 that includes six stations, labeled 711 through 716. All stations in the multi-station apparatus 700 with a single process chamber 703 are exposed to the same pressure environment. However, each station may have individual local plasma and heating conditions achieved by a dedicated plasma generator and pedestal, such as the ones illustrated in FIG. 6.

A substrate to be processed is loaded from one of the cassettes 703 through a load-lock 705 into the station 711. An external robot 707 may be used to transfer the substrate from the cassette 703 and into the load-lock 705. In the depicted embodiment, there are two separate load locks 705. These are typically equipped with substrate transferring devices to move substrates from the load-lock 705 (once the pressure is equilibrated to a level corresponding to the internal environment of the process chamber 703) into the station 711 and from the station 716 back into the load-lock 705 for removal from the processing chamber 703. An internal robot 709 is used to transfer substrates among the processing stations 711-716 and support some of the substrates during the process as described below.

In certain embodiments, one or more stations may be reserved for heating the substrate. Such stations may have a heating lamp (not shown) positioned above the substrate and/or a heating pedestal supporting the substrate similar to one illustrated in FIG. 6. For example, a station 711 may receive a substrate from a load-lock and be used to pre-heat the substrate before being further processed. Other stations may be used for filling TSVs and partial removal of the tungsten layer from the field region.

After the substrate is heated or otherwise processed at the station 711, the substrate is moved successively to the processing stations 712, 713, 714, 715, and 716, which may or may not be arranged sequentially. The multi-station apparatus 700 is configured such that all stations are exposed to the same pressure environment. In so doing, the substrates are transferred from the station 711 to other stations in the chamber 701 without a need for transfer ports, such as load-locks.

The internal robot 709 is used to transfer substrates between stations 711-716. The robot 709 includes a fin with at least one arm for each processing station (shown extending between stations). At the end of the arm adjacent to the processing stations are four fingers that extend from the arm with two fingers on each side. These fingers are used to lift, lower, and position a substrate within the processing stations. For example, in one embodiment, where the multi-station apparatus includes six processing stations, the spindle assembly is a six arm rotational assembly with six arms on one fin. For example, as shown in the drawings the fin of the spindle assembly includes six arms, with each arm having four fingers. A set of four fingers, i.e., two fingers on a first arm and two fingers on an adjacent, second arm, are used to lift, position and lower a substrate from one station to another station. In this manner, the apparatus is provided with four fingers per pedestal, per station and per substrate.

In certain embodiments, one or more stations may be used to fill TSVs with tungsten. For example stations 712, 713, and 714 may be used for this process, while stations 715 and 716 are used for partial etching of the initial tungsten layer from the field region. Station 711 may be used for pre-heating in this example. It should be understood that any configurations of station designations to specific processes (heating, filling, and removal) may be used. In certain embodiments, all six stations are used for partial removal of a tungsten layer. In other embodiments, the station 711 are used for pre-heating, while stations 712-716 are used for layer removal.

As an alternative to the multi-station apparatus described above, the method may be implemented in a single substrate chamber or a multi-station chamber processing a substrate(s) in a single processing station in batch mode (i.e., non-sequential). In this aspect of the invention, the substrate is loaded onto the pedestal of the single processing station (whether it is an apparatus having only one processing station or an apparatus having multi-stations running in batch mode). The substrate may be then heated. TSV filling operations are then performed in a manner similar to the ones described above. The process conditions in the chamber are then adjusted and the partial removal of the tungsten layer is then performed. However, the substrate remains at the same station during the entire sequence of the processes.

Figure 7B:
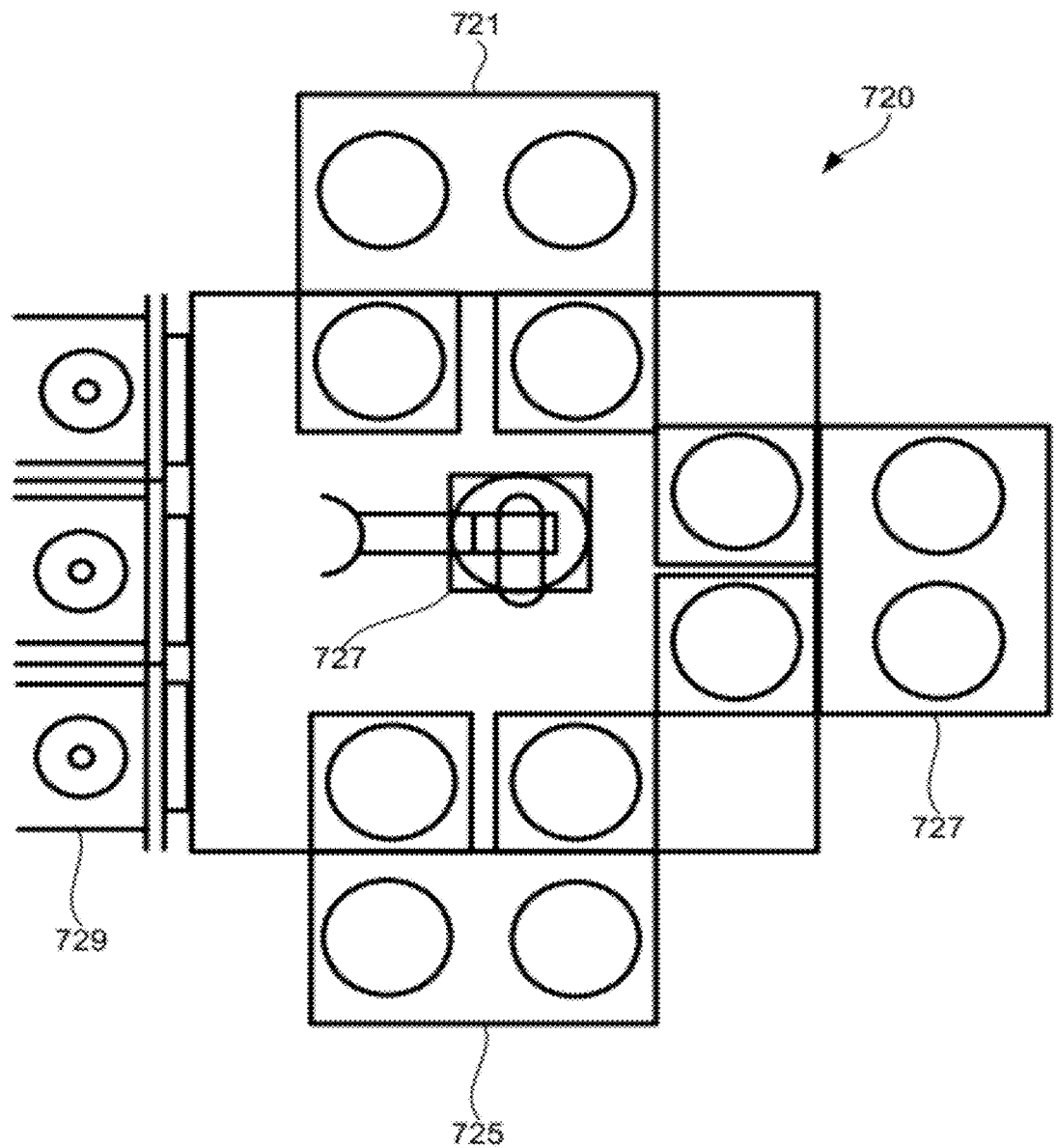
FIG. 7B is a schematic illustration of a multi-chamber stripping apparatus, in accordance with certain embodiments, for processing a partially fabricated semiconductor substrate that includes partial removal of the initial tungsten layer from the substrate having one or more TSVs.

FIG. 7B is a schematic illustration of a multi-chamber stripping apparatus 720 that may be used in accordance with certain embodiments. As shown, the apparatus 720 has three separate chambers 721, 723, and 725. Each of the chambers 721-725 has two pedestals. Each chamber 721-725 has its own pressure environment, which is not shared between chambers. Each chamber may have one or more corresponding transfer ports (e.g., load-locks). The apparatus may also have a shared substrate handling robot 727 for transferring substrates between the transfer ports one or more cassettes 729. Each station may be controlled by a system controller 731 that, among other functions, control positions of the low-emissivity pedestal in the corresponding stations.

Experimental

Figure 8:
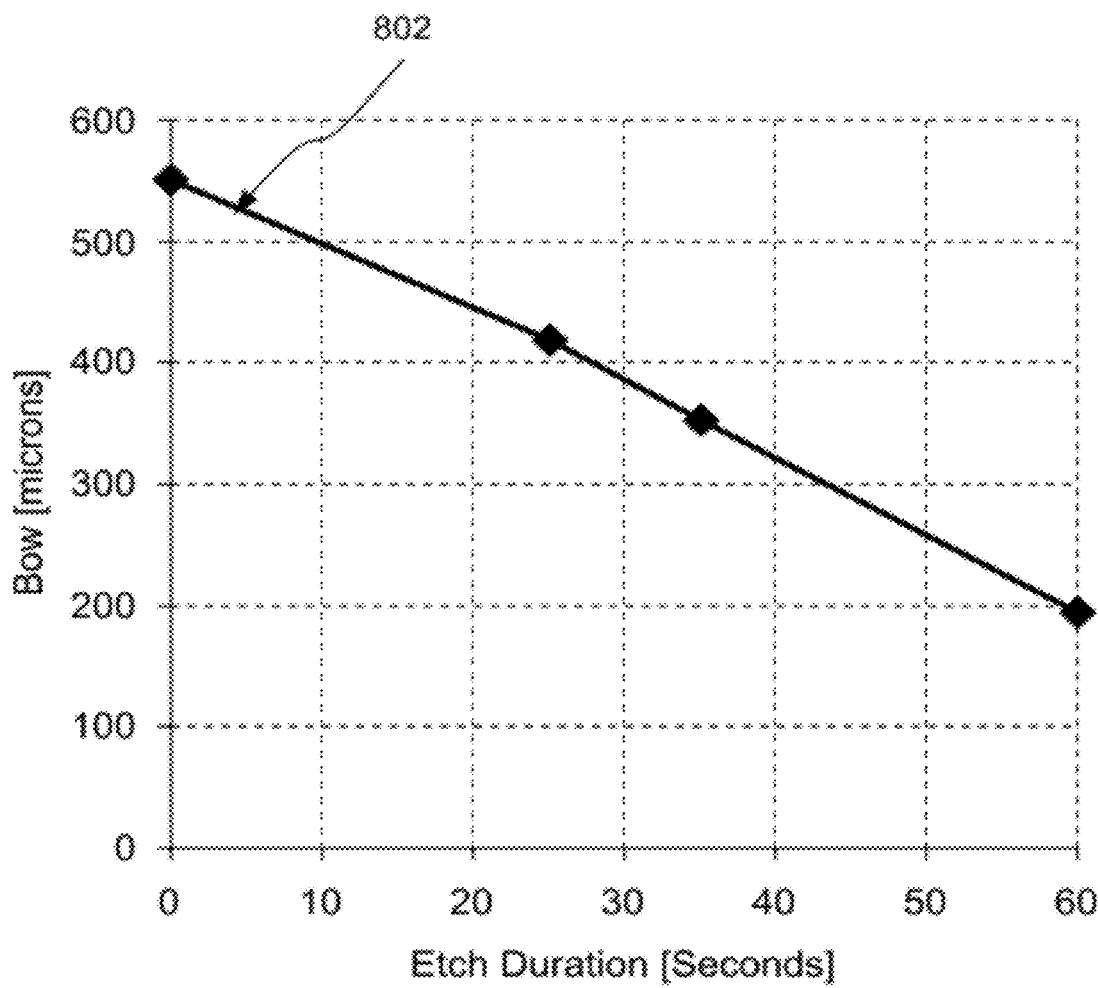
FIG. 8 is a plot illustrating wafer bowing as a function of etching duration.

A series of experiments were conducted to determine effects of the proposed method on substrate bowing. It was found that substrate bowing is approximately inverse proportional to the etching duration for certain process conditions as illustrated in FIG. 8. It was also found that etching only a part of the initial tungsten layer keeps the TSVs "closed." The process clearly helped to address bowing issues.

In one experiment, TSVs were simulated with smaller vias that had the opening diameters of about 130 nanometers and the aspect ratios of about 10. Several substrates with these smaller vias were deposited with tungsten, such that the vias were completely filled. The deposition process parameters included: the chamber pressure of about 40 Torr, the substrate temperature of about 395° C., the flow rate of tungsten hexafluoride (WF$_6$) is about 300 sccm. The CVD followed a standard PNL process described above. The etching process parameters included: the chamber pressure of about 6 Torr, the flow rate of nitrogen trifluoride (NF$_3$) is about 1375 sccm, the substrate temperature of about 300° C., the etching duration of about 7 seconds. The substrates were then divided into two groups. The first group was inspected after the tungsten deposition (i.e., via filling). The second group was subjected to partial removal of the tungsten layer formed during the deposited and then inspected.

It was found that the substrates in the first group had tungsten layers deposited on the field regions. These layers had an average thickness of about 950 Angstroms (95 nanometers). This tungsten layer thickness depends on a TSV opening diameter. In this experiment, the filling of the 130-nanometer vias lead to formation of a tungsten layer that is about 95 nanometers thick. As described above, TSV may have opening diameters as large as 50 micrometers (50,000 nanometers) resulting in much thicker than 95-nanometer layer on the field region.

Cross-sections of the substrates in the first group revealed that the vias had seams extending towards the filled region. These seams typically ended (i.e., "closed") at least about 300 nanometers below the top substrate surface. Further, the cross-sections revealed that the indentations above the vias in the tungsten layer have their lowest point at approximately the level of the substrate's top surface.

Cross-sections of the substrates in the second group (the ones that were etched) revealed that the thickness of the tungsten layer in the filled region reduced to about 59 nanometers on average, or about 40% less than for the first group. Even with such a thin remaining layer, vias remained "closed." It should be noted that in many applications an etched tungsten layer is expected to be much thicker than 59 nanometers. Therefore, risk of via opening should be even less.

Another experiment was designed to evaluate effects of etching on substrate bowing. Substrates selected for this experiment were 300-millimeter wafer with a thickness of about 0.72 millimeters thick. It should be noted that both of these dimensions have an impact on substrate bowing. It should be also noted that the deposited tungsten layer contributed less than 0.1% to the overall thickness. All wafers were deposited with the tungsten layers using the following process parameters: the chamber pressure of about 40 Torr, the substrate temperature of about 395° C., the flow rate of tungsten hexafluoride (WF$_6$) is about 300 sccm. The CVD followed a standard PNL process described above.

Some wafers were analyzed right after deposition. A thickness of the tungsten layer in the field region was estimated to be about 6075 Angstroms. Bowing of these wafers was on average about 579 micrometers. As indicated in the above description, such a level of bowing may be not acceptable for many types of substrate handling equipment. In another test, residual compression stress of the deposited tungsten layers was measures and was estimated to be about 1.55 GPa on average. This corresponds to a typical value of a "high-stress tungsten" morphological structure.

Other wafers in this experiment were subjected to etching for 130 seconds at the chamber pressure of about 6 Torr, the flow rate of nitrogen trifluoride (NF$_3$) is about 1375 sccm, the substrate temperature of about 300° C., the etching duration of about 7 seconds. After the etching, the same set of measurements (layer thickness, bowing, and residual stress) was performed on the etched wafers. It was found that the thickness of the tungsten layer in the field region decreased to about 3942 Angstroms on average (about 35% thinner after etching). Bowing of these wafers was on average about 359 micrometers (about 38% less after etching). It should be noted that this bowing value is slightly higher than was expected from the correlation provided Table 2 above. The difference may be attributed to different types of wafers and processing conditions. Nevertheless, the overall trend of bowing decreasing as a tungsten layer in the field region becomes thinner remains.

Residual compression stress of the etched tungsten layer was estimated to be about 1.65 GPa on average. It is important to point out that etching does not relieve the stress in the layer. Without being restricted to any particular theory, it is believed that reduction in bowing is probably entirely attributable to changes in a tungsten layer thickness.

In yet another experiment, three 300-mm wafers were first deposited with a tungsten layer on the field region using three different deposition profiles and then etched using the same etching profile but for different periods. The thickness of the first wafer was about 0.775 millimeters, second—0.7498 millimeters, and third—0.7224 millimeters. The deposition conditions for all three wafer were the same as in the experiments described above. The target thickness was set to about 9800 Angstroms for each deposition.

A tungsten layer thickness and bowing were measured for each wafer after deposition (and before etching). The results of this measurement are presented in Table 3 below. Even though different deposition conditions were used, the wafer bowing strongly correlates with the thickness.

The wafers were then subjected to etching using the same process conditions: chamber pressure of about 10 Ton, a flow rate of NF3 through the remote plasma generator of about 300 sccm, and the wafer temperature of about 395° C. As it was mentioned above, etching duration was different for each wafer. The first wafer was etched for about 25 seconds, the second—for about 35 seconds, and the third—for about 60 seconds. A tungsten layer thickness and bowing were measured again for each wafer after etching. The results are also presented in Table 3.

TABLE 3

| Wafer No. | After Deposition/Before Etching | | Etching Duration | After Etching | |
|---|---|---|---|---|---|
| | Layer Thickness | Bow | | Layer Thickness | Bow |
| 1 | ~9689 Å | ~563 μm | 25 seconds | ~4771 Å | ~419 μm |
| 2 | ~9939 Å | ~535 μm | 35 seconds | ~5289 Å | ~352 μm |
| 3 | ~9801 Å | ~549 μm | 60 seconds | ~3040 Å | ~194 μm |

FIG. 8 is a plot illustrating wafer bowing as a function 802 of etching duration for the above experiment. The first point corresponds to no etching (0 seconds) and is an average value of the bowing of three wafers. The second point corresponds to bowing of the first wafer after etching and so on. It should be noted that the points of this function 802 forms approximately a straight line, i.e., bowing is approximately inverse proportional to etching duration.

Conclusion

Although the foregoing invention has been described in some detail for purposes of clarity of understanding, it will be apparent that certain changes and modifications may be practiced within the scope of the appended claims. It should be noted that there are many alternative ways of implementing the processes, systems and apparatus of the present invention. Accordingly, the present embodiments are to be considered as illustrative and not restrictive, and the invention is not to be limited to the details given herein.

What is claimed is:

1. A method of processing a partially manufactured semiconductor substrate with one or more through silicon vias, the method comprising:
positioning the substrate on a layer processing station of a processing chamber, wherein the substrate includes the one or more through silicon vias filled with tungsten and an initial tungsten layer formed on a field region of the substrate, wherein the initial tungsten layer has an intrinsic residual stress that causes an interior portion of the substrate to deviate from a plane defined by edges of the substrate,
exposing the field region of the substrate to an etchant; and
removing a part of the initial tungsten layer to form an etched tungsten layer substantially covering the field region of the substrate and the one or more through silicon vias such that the through silicon vias remain filled, wherein the etched tungsten layer has an intrinsic residual stress that is less than the intrinsic residual stress of the initial tungsten layer such that the deviation of the substrate from the plane is reduced after forming the etched tungsten layer.

2. The method of claim 1, wherein the deviation of the substrate from the plane is at least about twice greater before forming the etched tungsten layer than after forming the etched tungsten layer.

3. The method of claim 1, wherein the deviation of the substrate from the plane before forming the etched tungsten layer exceeds a predetermined level corresponding to a substrate handling device, and wherein the deviation of the substrate from the plane after forming the etched tungsten layer is within the predetermined level.

4. The method of claim 1, wherein the substrate is a 300-millimeter wafer.

5. The method of claim 1, wherein the substrate is a 450-millimeter wafer.

6. The method of claim 1, wherein at least one of the one or more through silicon vias has an aspect ratio of greater than about 10.

7. The method of claim 1, wherein at least one of the one or more through silicon vias has an aspect ratio of greater than about 20.

8. The method of claim 1, wherein at least one of the one or more through silicon vias has an opening diameter of at least about 200 nanometers.

9. The method of claim 1, wherein at least one of the one or more through silicon vias has an opening diameter of at least about 2 micrometers.

10. The method of claim 1, wherein the initial tungsten layer is on average at least about twice thicker than the etched tungsten layer.

11. The method of claim 1, wherein the average thickness of the etched tungsten layer is less than about 2 micrometers.

12. The method of claim 1, wherein an in-situ plasma is not generated in the processing chamber during the exposing and the removing.

13. The method of claim 1, wherein the etchant is introduced into the processing chamber during the exposing from a remote plasma generator.

14. The method of claim 1 further comprising depositing tungsten to fill the one or more through silicon vias with tungsten, wherein the depositing is performed on a deposition station of the processing chamber and wherein the substrate stays above a predetermined substrate transferring temperature during transferring from the deposition station to the layer processing station.

15. The method of claim 1 further comprising depositing tungsten to fill the one or more through silicon vias with tungsten, wherein the depositing is performed on the layer processing station of the processing chamber.

16. The method of claim 1, further comprising heating the substrate and the initial tungsten layer to a predetermined temperature using a heating element of the layer processing station, wherein the predetermined temperature is selected to induce a chemical reaction between the initial tungsten layer and an etchant.

17. The method of claim 1, wherein the initial tungsten layer extending above and adjacent to the one or more through silicon vias substantially covers the field region of the substrate.

18. The method of claim 4, wherein the deviation of the substrate from the plane after forming the etched tungsten layer is less than about 500 micrometers.

19. The method of claim 4, where the substrate has an average thickness of between about 0.5 millimeters and about 1.0 millimeter.

20. The method of claim 16, wherein the predetermined temperature is at least about 300° C.

21. A method of processing a partially manufactured semiconductor substrate, the method comprising:
providing the substrate with one or more through silicon vias filled with tungsten and an initial tungsten layer formed on a field region of the substrate during filling of the one or more through silicon vias, wherein the substrate is a 300-mm wafer and at least one of the one or more through silicon vias has an aspect ratio of greater than about 10 and an opening diameter of at least about 1 micrometer, and wherein the initial tungsten layer extends above and adjacent to the one or more through silicon vias substantially covering the field region of the substrate and has an intrinsic residual stress that causes an interior portion of the substrate to deviate from a plane defined by edges of the substrate;
exposing the field region of the substrate to an etchant, wherein the etchant comprising activated fluorine species; and
removing a part of the initial tungsten layer to form an etched tungsten layer substantially covering the field region of the substrate and the one or more through silicon vias such that the through silicon vias remain filled, wherein the average thickness of the etched tungsten layer is at least twice less than the average thickness of the initial tungsten layer, and wherein the etched layer has an intrinsic residual stress that is less than the intrinsic residual stress of the initial tungsten layer such that the deviation of the substrate from the plane is reduced after forming the etched tungsten layer.

22. A semiconductor processing apparatus for processing a partially manufactured semiconductor substrate, the apparatus comprising:
a processing chamber having a layer processing station for positing the substrate;
a heating element configured to heat the substrate to a predetermined temperature; and
a controller comprising program instructions for:
positioning the substrate on the layer processing station, wherein the substrate includes the one or more through silicon vias filled with tungsten and an initial tungsten layer formed on a field region of the substrate and having an intrinsic residual stress that causes an interior portion of the substrate to deviate from a plane defined by edges of the substrate;

exposing the field region of the substrate to an etchant; and removing a part of the initial tungsten layer to form an etched tungsten layer substantially covering the field region of the substrate and the one or more through silicon vias such that the through silicon vias remain filled, wherein the etched tungsten layer has an intrinsic residual stress that is less than the intrinsic residual stress of the initial tungsten layer such that the deviation of the substrate from the plane is reduced after forming the etched tungsten layer.

\* \* \* \* \*